United States Patent
Spano

Patent Number: 6,134,685
Date of Patent: *Oct. 17, 2000

[54] PACKAGE PARALLEL TEST METHOD AND APPARATUS

[75] Inventor: John D. Spano, Austin, Tex.

[73] Assignee: Advanced Micro Devices, Inc., Sunnyvale, Calif.

[*] Notice: This patent is subject to a terminal disclaimer.

[21] Appl. No.: 09/039,816

[22] Filed: Mar. 16, 1998

[51] Int. Cl.⁷ .................................................. G01R 31/28
[52] U.S. Cl. .................... 714/724; 714/733; 324/73.1; 324/763; 324/765
[58] Field of Search .................... 714/725, 736, 714/724, 733, 738, 742; 324/73.1, 754, 762, 765; 637/8

[56] References Cited

U.S. PATENT DOCUMENTS

| | | | |
|---|---|---|---|
| 3,781,683 | 12/1973 | Freed | 324/765 |
| 4,829,237 | 5/1989 | Segawa et al. | 324/73.1 |
| 4,943,767 | 7/1990 | Yokota | 324/758 |
| 5,235,271 | 8/1993 | Kira | 324/763 |
| 5,321,352 | 6/1994 | Takebuchi | 324/758 |
| 5,360,747 | 11/1994 | Larson et al. | 438/10 |
| 5,525,912 | 6/1996 | Momohara | 324/754 |
| 5,550,480 | 8/1996 | Nelson et al. | 324/754 |
| 5,566,186 | 10/1996 | Paterson et al. | 714/736 |
| 5,712,858 | 1/1998 | Godiwala et al. | 714/724 |
| 5,818,249 | 10/1998 | Momohara | 324/762 |

*Primary Examiner*—Emmanuel L. Moise
*Attorney, Agent, or Firm*—Crawford PLLC

[57] ABSTRACT

A method for partial parallel testing a plurality of integrated circuit packages using a multi-package tester head having a plurality of sockets. Each socket is used for testing an integrated circuit package. A first one of the sockets has a full complement of signal channels, and the other sockets have exclusive subsets of the full complement of signal channels. The first socket and the other sockets support parallel testing of the integrated circuit packages according to a first type of test. Only the first socket, with its full complement of signal channels, supports a second type of test. To test a plurality of integrated circuit packages, a group of packages are inserted in the sockets. A first-pass test is then performed, in parallel, on the packages in the sockets. Then, for packages that passed the first-pass test, second-pass testing is performed sequentially using the first socket.

22 Claims, 4 Drawing Sheets

PACKAGE PARALLEL TEST METHOD AND APPARATUS

FIELD OF THE INVENTION

The present invention is generally directed to a method and apparatus for testing integrated circuits, and more particularly to a method for testing a plurality of integrated circuit packages.

BACKGROUND

Delivery of high quality parts and controlling production costs are often competing objectives for semiconductor manufacturers as they are for other types of businesses. One area where these objectives compete is in the testing of wafers and integrated circuit packages.

Various test techniques include sequential chain testing or "scan" testing, and built-in self-testing (BIST). Tests that use scan and/or BIST techniques typically require moderate incremental hardware costs. However, the yield rate for circuits subjected to scan and BIST tests alone is not great enough to proceed to package assembly or customer delivery because some circuits may pass the scan and BIST tests and still be inoperable when packaged. Therefore, machine-mode parallel pattern testing and parametric tests are performed after the scan and BIST tests. The drawback to machine-mode and parametric testing is that they require a full complement of channels for signals and power. The result is that duplication of expensive test equipment is required to increase test throughput using conventional parallel test technology with microprocessor and VLSI devices.

A general comparison of tester hardware required for memory devices versus tester hardware required for VLSIs is provided below for the purpose of illustrating the hardware required for machine-mode and parametric testing of VLSIs. VLSI testers do not support the parallel test cost advantages that are inherent in testers for memory devices. This is because VLSI testers effectively require a "complete tester" per signal channel. In other words, VLSI testers are sometimes referred to as "tester-per-pin" or "tester-per-channel" architecture. A memory tester has signal channels that are shared by the internal hardware of the tester for processing test vector information, where a test vector is comprised of addresses and data.

Sharing hardware by multiple signal channels and testing multiple devices in parallel provides a highly efficient parallel test capability for memory testers. However, signal channels of VLSI testers do not share hardware because of the characteristics of VLSI devices. A signal channel of a VLSI tester must support exclusive and unique vector data that is generally random in nature rather than algorithmic. In memory testers, there is generally a simple algorithmic relationship between vector addresses and data to be written to those addresses. Thus vector generation can be accomplished with relatively simple, low-cost hardware, commonly referred to as Algorithmic Pattern Generators (APGs). Because of certain shared characteristics between test vectors, APG units can be shared by signal channels for testing a single memory device, testing multiple memory devices in parallel.

With VLSI testers, the hardware that supports the signal channels must be capable of producing test vectors which are exclusively distinct or different from one signal channel to another signal channel. The widely varying test vectors are not compatible with testers having signal channels shared between hardware. Instead, VLSI testers have exclusively associated with each signal channel a very large storage capability for storing vector information.

A tester which employs for each signal channel, exclusive test vector memory, parametric measurement units, along with standard pin drivers and device output comparators, is referred to as a tester with TESTER-PER-PIN architecture. These types of testers are very expensive given the extensive hardware required.

Conventional parallel testing of microprocessor devices has been found to be expensive relative to the corresponding increase in testing throughput. As explained above, a large part of the expense is driven by the hardware requirements for high-performance machine-mode and parametric testing. In addition, relatively short test times may not justify the hardware expense for parallel testing.

SUMMARY OF THE INVENTION

The present invention is directed to a method and apparatus for testing a plurality of integrated circuit packages. In a first embodiment, the method uses a multi-package tester head having a plurality of sockets, wherein a first one of the sockets has a predetermined number of signal channels and each of the other sockets has a plurality of signal channels that is a functional subset of the predetermined number of signal channels of the first socket. The method comprises the steps of: inserting a plurality of packages in respective ones of the sockets; performing a first-pass test in parallel on the packages present in the sockets; performing a second-pass test on a package using the first socket; and moving, successively, remaining ones of the packages to the first socket and repeating the step of performing the second-pass test for each of the packages.

In another embodiment, the multi-package tester head is used wherein the parallel testing is performed after the individual testing of the packages using the first socket. Specifically, the method comprises the steps of: inserting the packages for a first time in the plurality of sockets; performing a first-pass test on a package using the first socket; moving, successively, remaining ones of the packages to the first socket and repeating the step of performing the first-pass test for each of the packages; inserting the packages for a second time in the plurality of sockets; and performing a second-pass test in parallel on the packages present in the sockets.

In still another embodiment, an apparatus is provided for testing a plurality of integrated circuit packages using the multi-package tester head. The apparatus comprises: means for inserting a plurality of packages in respective ones of the sockets; means for performing a first-pass test in parallel on the packages present in the sockets; means for performing a second-pass test on a package using the first socket; and means for moving, successively, remaining ones of the packages to the first socket and repeating the step of performing the second-pass test for each of the packages.

Another embodiment of the apparatus for testing the plurality of packages comprises: means for inserting for a first time the packages in the plurality of sockets; performing a first-pass test on a package using the first socket; means for moving, successively, remaining ones of the packages to the first socket and repeating the step of performing the first-pass test for each of the packages; means for inserting for a second time the packages in the plurality of sockets; and means for performing a second-pass test in parallel on the packages present in the sockets.

The above summary of the present invention is not intended to describe each illustrated embodiment or every implementation of the present invention. The figures in the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
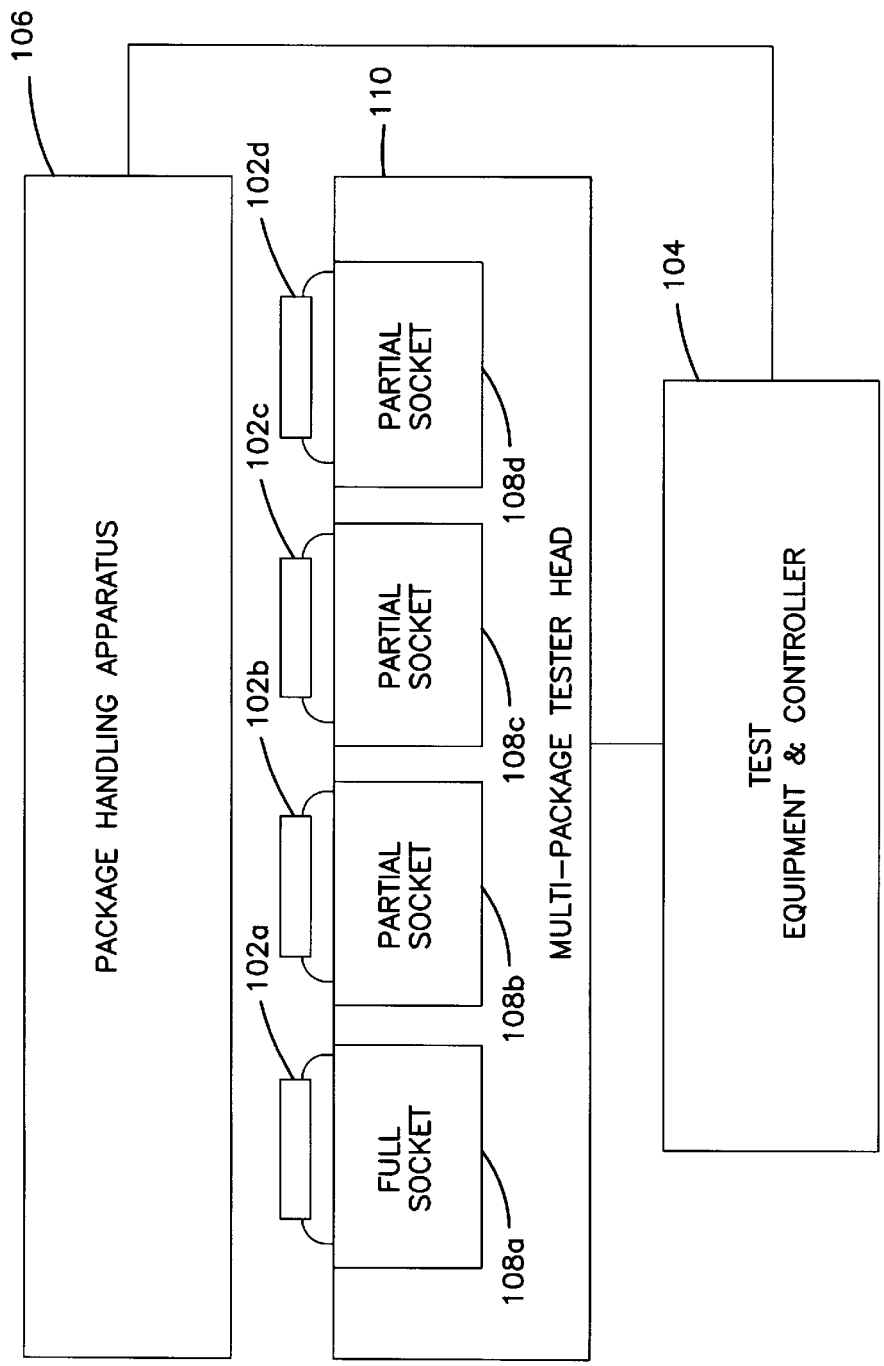
FIG. 1 is a block diagram of an example test system according to an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of arrangements for testing integrated circuits, and believed to be particularly applicable to testing a plurality of packages of integrated circuits. While the present invention is not limited to such devices, an appreciation of various aspects of the invention will be gained through a discussion of various example embodiments provided below.

The system of FIG. 1 is arranged to test a plurality of integrated circuit packages 102a, 102b, 102c, and 102d, such as, the package of the K6 processor from AMD, Inc. Various functional tests are performed under control of test equipment 104. An example tester comprising the test equipment 104 is the J973 Series tester from Teredyne. Test equipment 104 applies test signals to the packages 102a–d and determines whether or not the packages passed the predetermined test. Test equipment and controller 104 also controls package handling apparatus 106, which inserts and removes packages 102a–d from sockets 108a, 108b, 108c, and 108d. An example package handler is the Flex 1000 handler from Delta Design. Test equipment 104 and package handling apparatus 106 are conventional apparatus recognized by those skilled in the art. While not shown, it will be appreciated that handling apparatus 106 is capable of moving packages between sockets 108a–d of the tester head 110 at the direction of controller 104, which is programmed to according to the functions set forth herein.

Sockets 108a–d illustrate an example plurality of test sites that are used for testing a plurality of integrated circuit packages 102a–d. Controller 104 directs alignment of package handling apparatus 106 for insertion of packages 102a–d in sockets 108a–d. Once packages 102a–d are inserted in sockets 108a–d, testing of the packages can commence.

The signal channel configuration associated with sockets 108a–d is used to enhance testing throughput through recognition that different types of tests require different signal channel resources. Specifically, a first predetermined suite of tests, for example, machine-mode microcode, parametric, and speed performance testing, requires a full complement of signal channels. Whereas, a second predetermined suite of tests, such as built-in self tests (BIST) and scan tests, require only a subset of a full complement of signal channels. For some of today's packages, as many as 300 signal channels are required for the first type of tests, while only about 16 signal channels are required for the second type of tests.

Full socket 108a is arranged for use with a full complement of signal channels, and partial sockets 108b–d are arranged for use with only a subset of a full complement of signal channels. Full socket 108a is used for both the first and second type of tests, while partial sockets 108b–d are used only for the second type of tests.

According to one aspect of the present invention, test resources are leveraged by performing first-pass tests in parallel (simultaneous in time), for example BIST and scan tests, on a plurality of packages 102a–d registered in sockets 108a–d. Note that the "first-pass" tests refer to those tests first performed on a package, and "second-pass" tests refer to a second set of tests performed on the package. After first-pass testing is complete for all packages 102a–d, second-pass testing is performed on the ones of packages 102a–d that passed the first-pass tests, using the full socket 108a. Tests performed in the second-pass are different from the tests performed in the first-pass and require the full complement of signal channels.

Figure 2:
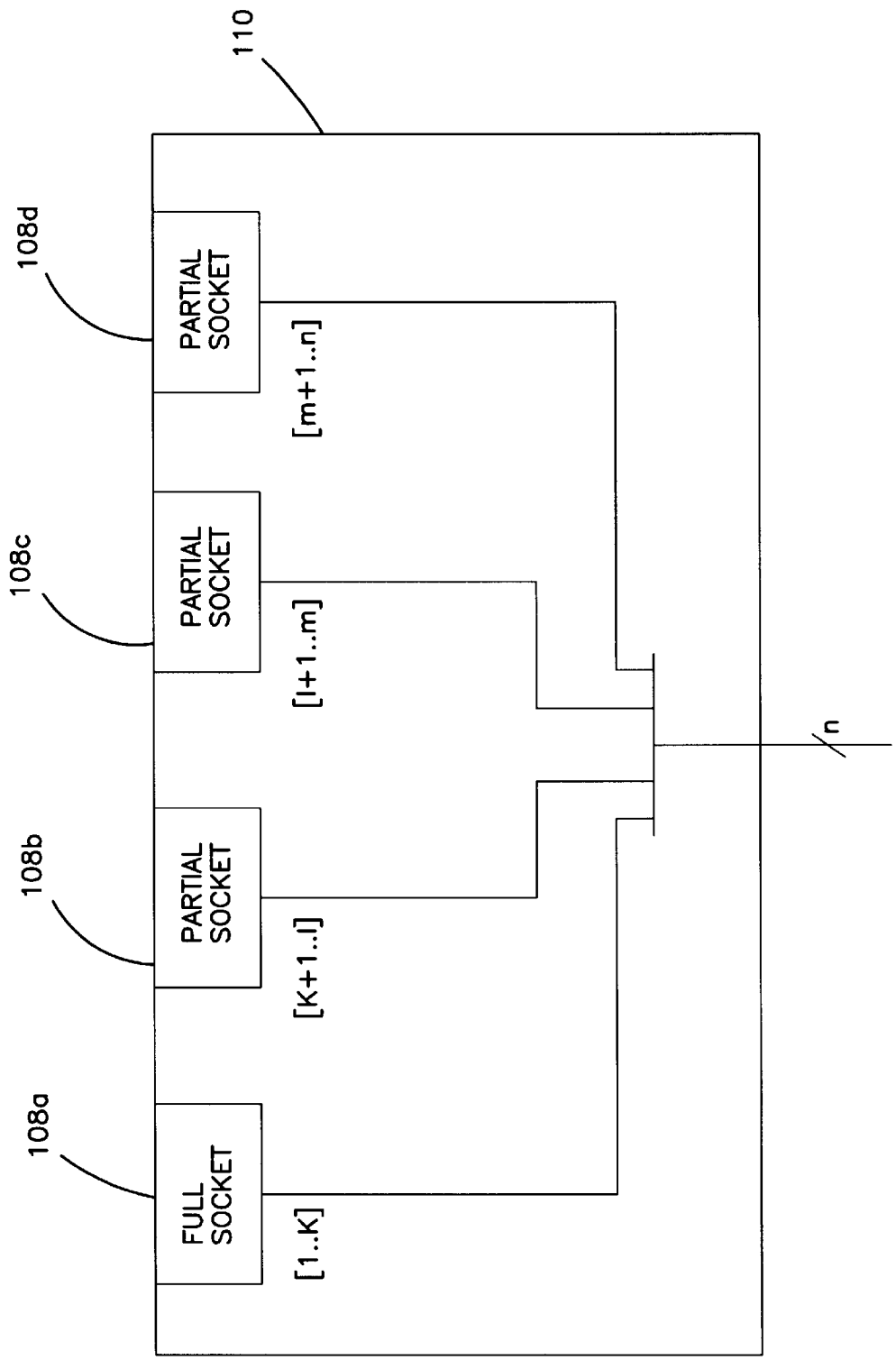
FIG. 2 is a block diagram of an example socket card in accordance with the present invention.

FIG. 2 illustrates a signal channel arrangement for an example tester head 110 according to the present invention. Tester head 110 includes an example plurality of conventional sockets 108a–d. While the sockets 108a–d themselves are conventional, it will be recognized that the usage of the sockets in combination with the arrangement of signal channels is novel.

Tester head 110 couples to n signal channels. In the example tester head 110, a full complement of signal channels, designated as [1 . . . k], is coupled to full socket 108a, a subset [k+1 . . . l] of the n signal channels is coupled to socket 108b, a subset [l+1 . . . m], is coupled to socket 108c, and a subset [m+1 . . . n], is coupled to 108d. Of the n signal channels, sockets 108a–d have physically exclusive subsets thereof for performing first-pass tests in parallel. Specifically, signal channels [1 . . . k] are physically exclusive of signal channels [k+1 . . . l], [l+1 . . . m], and [m+1 . . . n]; signal channels [k+1 . . . l] are exclusive of [1 . . . k], [l+1 . . . m], and [m+1 . . . n]; signal channels [l+1 . . . m] are exclusive of signal channels [1 . . . k], [k+1 . . . l], and [m+1 . . . n]; and signal channels [m+1 . . . n] are exclusive of [1 . . . k], [k+1 . . . l], and [l+1 . . . m].

The signal channels [k+1 . . . l], [l+1 . . . m], and [m+1 . . . n], while physically exclusive from one another, are functionally the same. That is the signal channels perform the same function relative to devices in the respective partial sockets 108b–d. Similarly, a subset of the signal channels [1 . . . k] is functionally the same as signal channels [k+1 . . . l], [l+1 . . . m], and [m+1 . . . n], but only when performing first-pass tests. Thus, the signal channel subsets [k+1. . . l], [l+1 . . . m], and [m+1 . . . n] are functional subsets of the full complement of signal channels [1 . . . k]. This permits the first-pass tests to be performed in parallel, and economically so, because the first-pass tests require far few testing resources than the second-pass tests.

While partial sockets 108b–d are shown as having fewer than a full complement of signal channels, it will be recognized that the partial sockets require electrical connections for all pins of the packages inserted therein. That is, unused pins of the packages cannot float during testing. Therefore, for example, partial socket 108b is coupled to circuitry (not shown) in addition to signal channels [k+1 . . . 1]. The additional circuitry is used to keep the pins of a package at ground or at a predetermined voltage level during testing. The additional circuitry is separate from the illustrated n signal channels, and it will be appreciated that the number of additional electrical channels for each of sockets 108b–d is determined by the number of package pins that are not used for parallel testing.

Figure 3:
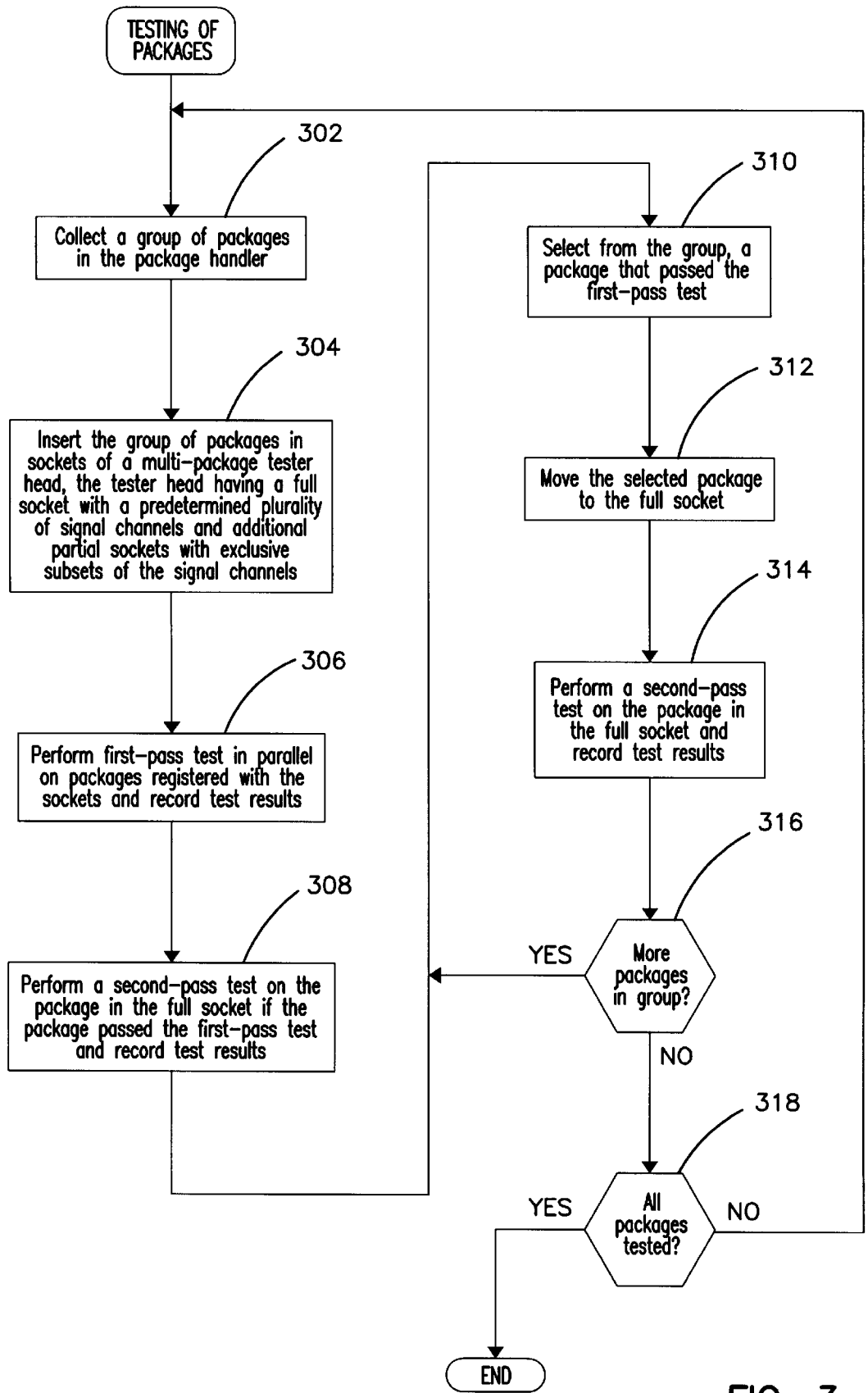
FIG. 3 is a flowchart of an example method according to the present invention.

FIG. 3 is a flowchart of an example method for testing a plurality of integrated circuit packages according to an embodiment of the present invention. At block 302, a group of packages is collected in a multi-package handling apparatus 106. The group of packages is then inserted in sockets of a multi-package tester head 110 at block 304. Recall that the tester head has a plurality of sockets where a first socket has a full complement of signal channels, and the other sockets have exclusive subsets of the full complement of signal channels. At block 306, under control of test equipment 104, a first-pass test is performed in parallel on packages that are present in the sockets of the tester head 110. It will be appreciated that the testing step includes the functions of tracking which packages are present in which sockets and which packages passed/failed the first-pass test. After the first-pass test is complete, processing continues at block 308.

Because the first socket of the tester head 110 includes a full complement of signal channels, at block 308, a second-pass test is performed on the package present therein if the package passed the first-pass test. If the package in the first socket did not pass the first-pass test, the second-pass test is not performed on the package. Next, from the group of packages, a package that passed the first-pass test is selected at block 310. Under control of controller 104 and as shown at block 312, the package handling apparatus 106 moves the selected package from one of the partial sockets 102b–d to the full socket 108a of the tester head 110. Packages that fail either of the first-pass or second-pass tests are identified by controller 104 and accordingly sorted by package handling apparatus 106.

Continuing now at block 314, a second-pass test is performed on the package present in the full socket 108a. If there are more packages in the group for which second-pass testing is required, processing block 316 directs control to block 310 as described above. When all packages in a group have been processed, or there are no remaining packages that passed the first-pass test, control is directed to block 318. If there are more packages to be tested, control block 318 returns control to block 302 to select another group of packages to test. Otherwise, testing of the packages is complete.

In another embodiment, it may be desirable to reverse the order of the first-pass and second-pass testing that is described along with FIG. 3. Specifically, it may be desirable to first performance test the packages and then perform in parallel the scan and BIST tests. The reason for first performance testing packages is that a package's temperature affects its performance. Thus, it is desirable to test packages at a known temperature relative to an expected performance level. Because performing scan and BIST tests causes the temperature of the package to increase, and a relatively high package temperature may cause the package to skew performance test results, the performance tests are performed prior to performing in parallel scan and BIST tests on a group of packages.

Figure 4:
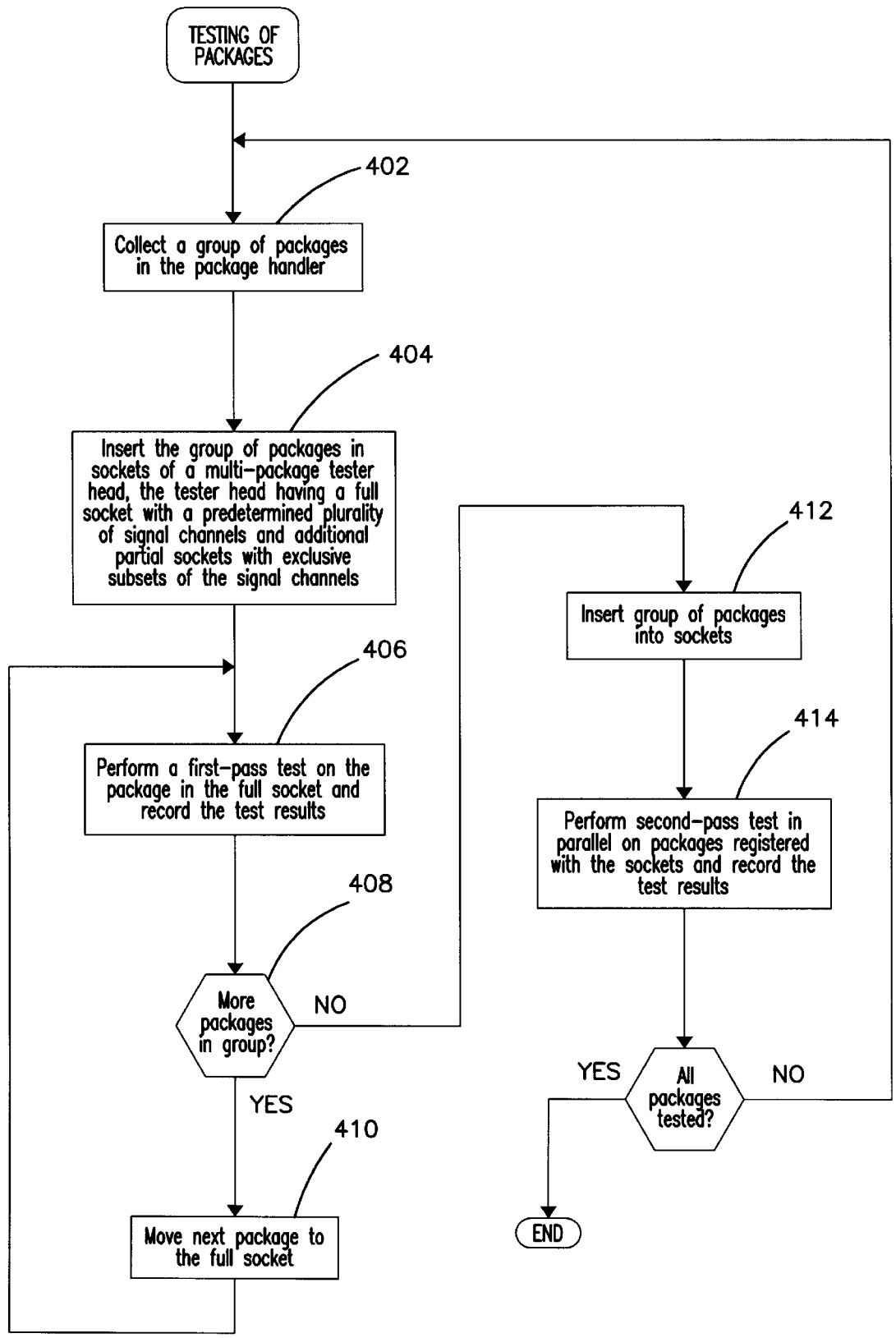
FIG. 4 is a flowchart of an example method according to another embodiment of the present invention.

FIG. 4 is a flowchart of a second method for testing integrated circuit packages according to another example embodiment of the invention. It will be appreciated that, in comparison to the method of FIG. 3, the method of FIG. 4 performs first-pass testing, using only the full socket, on each of the packages. Then, second-pass testing is performed in parallel on the group of packages.

At block 402, a group of packages is collected in a multi-package handling apparatus 106. The group of packages is then inserted in sockets of a multi-package tester head 110 at block 404. At block 406, under control of test equipment 104, a first-pass test is performed on the package that is present in the full socket. It will be appreciated that the testing step includes the functions of tracking which packages are present in which sockets and which packages passed/failed the first-pass test. After the first-pass test is complete, processing continues at block 408.

Decision block 408 tests whether there are more packages in the group that require testing at the full socket. If so, control is directed to block 410 where another one of the packages in the group is moved into the full socket. Control is then returned to block 406.

When all the packages in the group have been first-pass tested in the full socket, control is directed to step 412 where the group of packages is inserted into the sockets 108a–d. At block 414, the second-pass test is performed in parallel on the group of packages and the test results are recorded for further the purpose of sorting the packages.

The above specification, examples, and data provide a complete description of the manufacture and use of the composition of the invention. Since many embodiments of the invention can be made without departing from the spirit and scope of the invention, the invention resides in the claims appended hereinafter.

I claim:

1. A method for testing a plurality of integrated circuit packages using a multi-package tester head having a plurality of sockets, wherein a first one of the sockets has a predetermined number of signal channels and each of the other sockets has a plurality of signal channels that is a functional subset of the predetermined number of signal channels of the first socket, comprising the steps of:

inserting a plurality of packages in respective ones of the sockets;

performing a first-pass test in parallel on the packages present in the sockets;

performing a second-pass test on a package using the first socket; and moving, successively, remaining ones of the packages to the first socket and repeating the step of performing the second-pass test for each of the packages.

2. The method of claim 1, wherein the second-pass test is only performed on packages passing the first-pass test.

3. The method of claim 1, wherein the first-pass test includes a sequential chain test.

4. The method of claim 3, wherein the first-pass test includes a built-in self-test.

5. The method of claim 4, wherein the second-pass test is a performance test.

6. The method of claim 1, wherein the first-pass test includes a built-in self-test.

7. The method of claim 6, wherein the second-pass test is a performance test.

8. The method of claim 1, wherein the second-pass test is a performance test.

9. A method for testing a plurality of integrated circuit packages using a multi-package tester head having a plurality of sockets, wherein a first one of the sockets has a predetermined number of signal channels and each of the other sockets has a plurality of signal channels that is a functional subset of the predetermined number of signal channels of the first socket, comprising the steps of:

inserting for a first time the packages in the plurality of sockets; performing a first-pass test on a package using the first socket;

moving, successively, remaining ones of the packages to the first socket and repeating the step of performing the first-pass test for each of the packages;

inserting for a second time the packages in the plurality of sockets; and performing a second-pass test in parallel on the packages present in the sockets.

10. The method of claim 9, wherein the second-pass test includes a sequential chain test.

11. The method of claim 10, wherein the second-pass test includes a built-in self-test.

12. The method of claim 11, wherein the first-pass test is a performance test.

13. The method of claim 12, wherein the first-pass test is a performance test.

14. The method of claim 9, wherein the first-pass test is a performance test.

15. An apparatus for testing a plurality of integrated circuit packages using a multi-package tester head having a plurality of sockets, wherein a first one of the sockets has a predetermined number of signal channels and each of the other sockets has a plurality of signal channels that is a functional subset of the predetermined number of signal channels of the first socket, comprising:

means for inserting a plurality of packages in respective ones of the sockets;

means for performing a first-pass test in parallel on the packages present in the sockets;

means for performing a second-pass test on a package using the first socket; and means for moving, successively, remaining ones of the packages to the first socket and repeating the step of performing the second-pass test for each of the packages.

16. An apparatus for testing a plurality of integrated circuit packages using a multi-package tester head having a plurality of sockets, wherein a first one of the sockets has a predetermined number of signal channels and each of the other sockets has a plurality of signal channels that is a functional subset of the predetermined number of signal channels of the first socket, comprising:

means for inserting for a first time the packages in the plurality of sockets;

means for performing a first-pass test on a package using the first socket;

means for moving, successively, remaining ones of the packages to the first socket and repeating the step of performing the first-pass test for each of the packages;

means for inserting for a second time the packages in the plurality of sockets; and means for performing a second-pass test in parallel on the packages present in the sockets.

17. An apparatus for testing a plurality of integrated circuit (IC) packages using a multi-package tester head having a plurality of sockets, wherein a first one of the sockets has a predetermined number of signal channels and each of the other sockets has a plurality of signal channels that is a functional subset of the predetermined number of signal channels of the first socket, comprising:

an IC package test arrangement including a package test controller and an automated package handler adapted to move IC packages in and out of ones of the sockets in response to commands from the package test controller, the IC package test arrangement being adapted to test the plurality of IC packages by inserting a plurality of packages in respective ones of the sockets;

performing a first-pass test in parallel on the packages present in the sockets;

performing a second-pass test on a package using the first socket; and moving, successively, remaining ones of the packages to the first socket and again performing the second-pass test for each of the packages.

18. The apparatus of claim 17, wherein the IC package test arrangement is further adapted to test the plurality of IC packages by including, in the first-pass test, at least one of a sequential chain test and a built-in self-test.

19. The apparatus of claim 17, wherein the IC package test arrangement is further adapted to test the plurality of IC packages by including, in the second-pass test, a performance test.

20. An apparatus for testing a plurality of integrated circuit (IC) packages using a multi-package tester head having a plurality of sockets, wherein a first one of the sockets has a predetermined number of signal channels and each of the other sockets has a plurality of signal channels that is a functional subset of the predetermined number of signal channels of the first socket, comprising:

an IC package test arrangement including a package test controller and an automated package handler adapted to move IC packages in and out of ones of the sockets in response to commands from the package test controller, the IC package test arrangement being adapted to test the plurality of IC packages by inserting for a first time the packages in the plurality of sockets;

performing a first-pass test on a package using the first socket;

moving, successively, remaining ones of the packages to the first socket and again performing the first-pass test for each of the packages;

inserting for a second time the packages in the plurality of sockets; and performing a second-pass test in parallel on the packages present in the sockets.

21. The apparatus of claim 20, wherein the IC package test arrangement is further adapted to test the plurality of IC packages by including, in the first-pass test, at least one of a sequential chain test and a built-in self-test.

22. The apparatus of claim 21, wherein the IC package test arrangement is further adapted to test the plurality of IC packages by including, in the second-pass test, a performance test.

* * * * *